United States Patent
Yamamoto

(10) Patent No.: US 6,700,519 B2
(45) Date of Patent: Mar. 2, 2004

(54) DELTA SIGMA TYPE AD CONVERTER

(75) Inventor: Yuji Yamamoto, Kawagoe (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 10/141,081

(22) Filed: May 9, 2002

(65) Prior Publication Data

US 2002/0171572 A1 Nov. 21, 2002

(30) Foreign Application Priority Data

May 16, 2001 (JP) ........................................ 2001-146598

(51) Int. Cl.[7] ............................................... H03M 3/00
(52) U.S. Cl. ................................................... 341/143
(58) Field of Search ........................................ 341/143

(56) References Cited

U.S. PATENT DOCUMENTS

| | | | |
|---|---|---|---|
| 5,392,042 A | * | 2/1995 | Pellon .......................... 341/143 |
| 5,736,950 A | | 4/1998 | Harris et al. ................. 341/143 |
| 5,760,722 A | | 6/1998 | Harris et al. ................. 341/143 |
| 5,838,270 A | * | 11/1998 | Kiriaki ......................... 341/143 |
| 5,982,315 A | * | 11/1999 | Bazarjani et al. ............ 341/143 |

* cited by examiner

Primary Examiner—Howard L. Williams
(74) Attorney, Agent, or Firm—Morgan, Lewis & Bockius LLP

(57) ABSTRACT

On a first stage of the delta sigma type AD converter for quantizing an input analog signal and converting it to an output digital signal. The computing element adds a feedback signal from a second stage DA converter and subtracts a feedback signal in which the output of the delay unit is multiplied at a coefficient α with a coefficient buffer and a feedback signal from the delay unit, the input analog signal is output to a computing element on a post stage, and quantization is executed with a predetermined sampling frequency by a quantizing element so as to convert it to an output digital signal. The frequency characteristic of quantization noise Q(Z) to be added by the quantizing element can be adjusted with the coefficient α, so that the relationship between the sampling frequency and the input frequency can be set up appropriately.

11 Claims, 6 Drawing Sheets

$H(Z) = -aX(Z)Z^{-4} + (1+\alpha Z^{-1}+Z^{-2})^2 Q(Z)$ $H(Z) = -aX(Z)Z^{-4} + (1+Z^{-2})^2 Q(Z)$

DELTA SIGMA TYPE AD CONVERTER

BACKGROUND OF THE INVENTION

1. Field of the Invention

The present invention relates to an AD converter, which quantizes input analog signals and converts to digital signals and outputs them, more particularly, to technical field of the delta sigma type AD converter having band pass filter transmission function.

2. Description of the Related Art

In recent years, public attention has been paid to a digital tuner, which receives analog broadcasting wave converts intermediate frequency (IF) signals obtained through a high frequency circuit to digital signals so as to digitize subsequent processing. The digital tuner utilizes a delta sigma type AD converter as a component for converting the IF signals to digital signals. Use of the delta sigma type AD converter enables quantization noise in the vicinity of the band of the IF signal frequency to be damped sufficiently, so as to achieve the quantization with a high resolution.

Generally, in the delta sigma type AD converter, the frequency of the IF signal to be input is set ¼ the sampling frequency. For example, if 10.7 MHz, which is a general IF frequency, is employed, the sampling frequency is set to 42.8 MHz. Alternatively, if folded frequency by the sampling frequency is used, the frequency of the IF signal to be input may be set ¾ the sampling frequency. In this case, the sampling frequency is set to 14.25 MHz to the IF signal of 10.7 MHz.

As described above, in the delta sigma type AD converter, the relationship between the frequency of the input signal and sampling frequency is fixed. However, the relationship of the frequency may be sometimes required to be changed for the reason of factors on the design of the apparatus. For example, a crystal vibrator is employed as reference of the sampling frequency and in some cases, its harmonic components overlap a receiving band of the digital tuner thereby disturbing it. To cope with such a case, it can be considered to change the sampling frequency and simultaneously change the frequency of the IF signal. However, although in the aforementioned 10.7 MHz case cheap components can be used because the frequency has be spread widely as the frequency of the IF signal, utilization of any special IF frequency raises the price of the components thereby inducing an increase of cost of the entire apparatus. In a conventional delta sigma type AD converter, the relationship of the frequency is apt to be fixed, so that it becomes difficult to adjust the relationship of the frequency depending on factors on the design.

SUMMARY OF THE INVENTION

Accordingly, the present invention has been achieved in views of the above problem problems and therefore, an object of the invention is to provide a delta sigma type AD converter in which by controlling a feedback amount from a delay device, the relationship between the IF signal and the sampling frequency can be set freely without being fixed, so that it can be adjusted corresponding to factors on the design and usage condition.

The above object of the present invention can be achieved by a n-order delta sigma type AD converter for quantizing an input analog signal and converting it to an output digital signal, provided with: a signal processing device which executes filter processing corresponding to a transmission function to said input analog signal; and a quantizing device which quantizes the input analog signal subjected to said filter processing with a sampling frequency, converts it to output digital signal, and outputs, wherein when quantizing noise applied by said quantizing device is Q(Z) and a predetermined coefficient is $\alpha$, said output digital signal includes a component indicated by $(1+\alpha Z^{-1}+Z^{-2})^n Q(Z)$.

According to the present invention, the input analog signal to the delta sigma type AD converter is subjected to filter processing corresponding to a predetermined transmission function and after that, quantized with a predetermined sampling frequency and converted to output digital signal. At this time, quantization noise Q(Z) added by the quantizing device is output as the component $(1+\alpha Z^{-1}+Z^{-2})^n Q(Z)$ based on operation of the aforementioned transmission function. Therefore, the frequency characteristic of the quantization noise Q(Z) can be adjusted freely depending upon setting of the coefficient $\alpha$, the relationship between the input analog signal and the sampling frequency does not have to be fixed and a frequency relationship fitting to design factors and use condition can be set up.

The above object of the present invention can be achieved by a delta sigma type AD converter for quantizing an input analog signal and converting it to an output digital signal, provided with: a computing device which subtracts a first feedback signal and a second feedback signal from said input analog signal and adds a third feedback signal thereto; a delay device which outputs the output of said computing device with a delay through two delay elements connected in series; a first feedback device which outputs the output of said delay device as said first feedback signal and multiplies the output of the delay element on a preceding stage contained in said delay device with a predetermined coefficient and outputs it as said second feedback signal; a quantizing device which quantizes the output of said delay device with a sampling frequency, converts it to output digital signal and outputs; and a second feedback device which converts said output digital signal to an analog signal and outputs it as said third feedback signal.

According to the present invention, the input analog signal to the delta sigma type AD converter is subjected to addition and subtraction relative to various feedback signals by the computing device, and its output is delayed by the delay device. After that, it is quantized by a predetermined sampling frequency and converted to output digital signals. On the other hand, a first feedback signal which is post stage output by the delay device composed of two stages and a second feedback signal which is obtained by multiplying the same output with a predetermined coefficient are output by a first feedback device. A third feedback signal which is obtained by converting the output digital signal to the analog signal is output by a second feedback device. Consequently, the frequency characteristic of quantization noise applied by the quantizing device based on setting of a predetermined coefficient can be adjusted freely by the operation of the first and the second feedback device. Thus, the relationship between the input analog signal and the sampling frequency does not have to be fixed like the first aspect of the invention, so that the frequency relationship fitting to design factors and use condition can be set up.

In one aspect of the converter of the present invention, respective stages each containing said computing device, said delay device, said first feedback device, said quantizing device, and said second feedback device are connected through n stages so as to construct n order.

According to the present invention, the delta sigma type AD converter of the n order can be realized by constructing the first stage with the components mentioned in the second aspect of the invention and connecting n stages thereof. Therefore, the n is set large if it is intended to damp the quantization noise largely and if reduction of cost is intended by simplifying the structure, the n is set small. Consequently, not only the above-described freedom in the frequency relationship is ensured, but also balance between performance and cost can be attained by selecting an optimum order.

In another aspect of the converter of the present invention, said first feedback device is constructed so as to be capable of changing over two or more coefficients as said predetermined coefficient.

According to the present invention, in addition to the structures mentioned in the second and third aspects, plural coefficients are prepared as the first feedback coefficient and they can be switched over. Therefore, by changing the quantity of the feedback from the pre-output of the delay device, the relationship between the frequency of the input analog signal and the sampling frequency can be switched and if it is used under a different use condition, an appropriate frequency relationship can be set up selectively.

According to the present invention, the relationship between the input frequency and the sampling frequency can be set freely without being fixed by controlling the amount of the feedback from the delay device in the delta sigma type AD converter. Consequently, it is possible to realize the delta sigma type AD converter which can be adjusted appropriately depending upon design factors and use condition.

In further aspect of the converter of the present invention, said input analog signal is an IF signal corresponding to broadcasting wave and said predetermined coefficient and said sampling frequency are set so that the frequency characteristic of said quantization noise has a transmission zero point in the frequency band of said IF signal.

According to the present invention, the analog IF signal is converted to digital signal by applying the aforementioned delta sigma type AD converter to a broadcasting receiver unit or the like. Therefore, by adjusting the transmission zero point of quantization noise so as to coincide with the frequency band of the IF signal, the IF signal can be quantized at a high resolution thereby improving reception performance.

In further aspect of the converter of the present invention, said predetermined coefficient and said sampling frequency are set so that the harmonics of said sampling frequency does not overlap the reception band of said broadcasting wave.

According to the present invention, in addition to the same operation as the fifth aspect, the sampling frequency can be set so that the harmonics of the sampling frequency does not overlap the reception band of broadcasting wave. Therefore, it is possible to prevent the reception performance from being deteriorated by jump into radio system of the harmonics of the sampling frequency.

In further aspect of the converter of the present invention, said first feedback device is constructed so as to be capable of switching a first coefficient corresponding to a first area and a second coefficient corresponding to a second area as said predetermined coefficient and capable of selecting a first sampling frequency corresponding to said first coefficient and a second sampling frequency corresponding to said second coefficient, and said first coefficient and said first sampling frequency are set so that harmonics of said first sampling frequency does not overlap the reception band of broadcasting wave in said first area while said second coefficient and said second sampling frequency are set so that the harmonics of the second sampling frequency does not overlap the reception band of broadcasting wave in said second area.

According to the present invention, if the delta sigma type AD converter is applied to a broadcasting receiver unit or the like and made available in two different areas, two combinations between a predetermined coefficient and sampling frequency are prepared such that they can be switched over. Consequently, it can be set so that one combination does not overlap broadcasting wave reception band of one area while the other combination does not overlap broadcasting wave reception band of the other area. Thus, only by changing setting of the same delta sigma type AD converter, it is possible to prevent reception performance from being deteriorated by jump into radio system of the harmonics of the sampling frequency in two areas each having a different reception band.

DESCRIPTION OF THE PREFERRED EMBODIMENTS

Hereinafter, the preferred embodiments of the present invention will be described with reference to the accompanying drawings. In this embodiment, a case where the present invention is applied to a delta sigma type AD converter for use in a digital tuner capable of receiving FM broadcasting and AM broadcasting.

Figure 1:
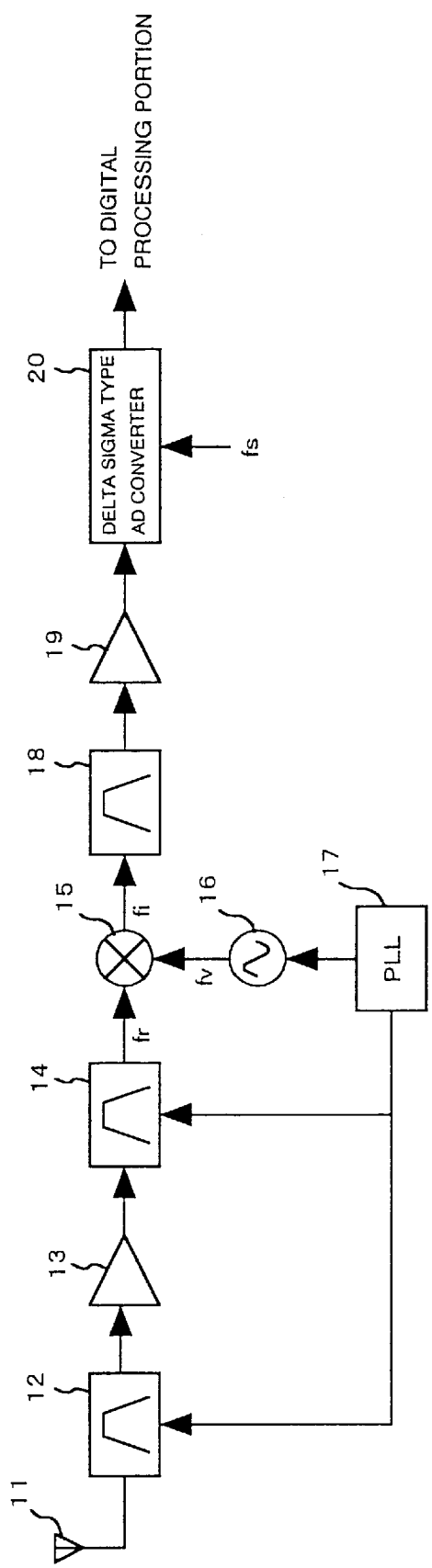
FIG. 1 is a block diagram showing the schematic structure of a digital tuner employing a delta sigma type AD converter according to the present invention.

FIG. 1 is a block diagram showing the schematic structure of the digital tuner employing the delta sigma type AD converter according to the present invention. FIG. 1 shows a circuit portion of the digital tuner for receiving broadcasting waves in which RF signal such as FM reception signal and AM reception signal is converted to the IF signal and it is AD-converted. FIG. 1 indicates an antenna 11, an antenna tuning circuit 12, an RF amplifier 13, an RF tuning circuit 14, a mixer portion 15, a VCO 16, a PLL 17, a band pass filter 18, an IF amplifier 19 and a delta sigma type AD converter 20.

With such a structure, a broadcasting electric wave from a broadcasting station is received by the antenna 11 and the reception signal is tuned to a predetermined frequency band by means of the antenna tuning circuit 12 and then output as the RF signal. A frequency band to be tuned by the antenna tuning circuit 12 changes depending on setting of the PLL 17. The RF signal output from the antenna tuning circuit 12 is amplified by the RF amplifier 13 and next, tuned in a narrower frequency band by the RF turning circuit 14, so that it is restricted to the vicinity of the frequency of a desired broadcasting station. The frequency band to be tuned by the RF tuning circuit 14 changes corresponding to the setting of the PLL 17. The RF signal whose band is restricted by the RF tuning circuit 14 is supplied to a mixer portion 15.

On the other hand, an oscillation signal from the voltage controlled oscillator (VCO) 16 is supplied to the mixer portion 15. This VCO 16 controls its oscillation frequency fv through the phase locked loop (PLL) 17. The PLL 17 controls itself so that the oscillation signal is synchronous with the reference signal in terms of the phase and an oscillation frequency fv corresponding to a desired broadcasting station is maintained. Then, the mixer 15 generates the IF signal by mixing the RF signal from the RF tuning circuit 14 with the oscillation signal of the VCO 16. Here, the frequency fi of the IF signal output from the mixer portion 15 is equivalent to a difference between the frequency fr of the RF signal and the oscillation frequency fv of the VCO 16. Because the frequency fi of the IF signal needs to be kept constant, it is necessary to control the oscillation frequency fv of the VCO 16 interlocked with the frequency of the desired broadcasting station by means of the PLL 17.

Next, the IF signal output from the mixer portion 15 is deprived of unnecessary frequency components by the band pass filter 18 and after that, amplified with a predetermined gain by the IF amplifier 19. Then, the IF signal output from the IF amplifier 19 is input to the delta sigma type AD converter 20 of the present invention and sampled with the sampling frequency fs. After that, it is converted to digital signals and output. Meanwhile, the detailed structure and operation of signal processing to be carried out in the delta sigma type AD converter 20 will be described later. Various kinds of digital processings are applied to the digital signal output from the delta sigma type AD converter 20 and finally output outside as a voice signal.

Figure 2:
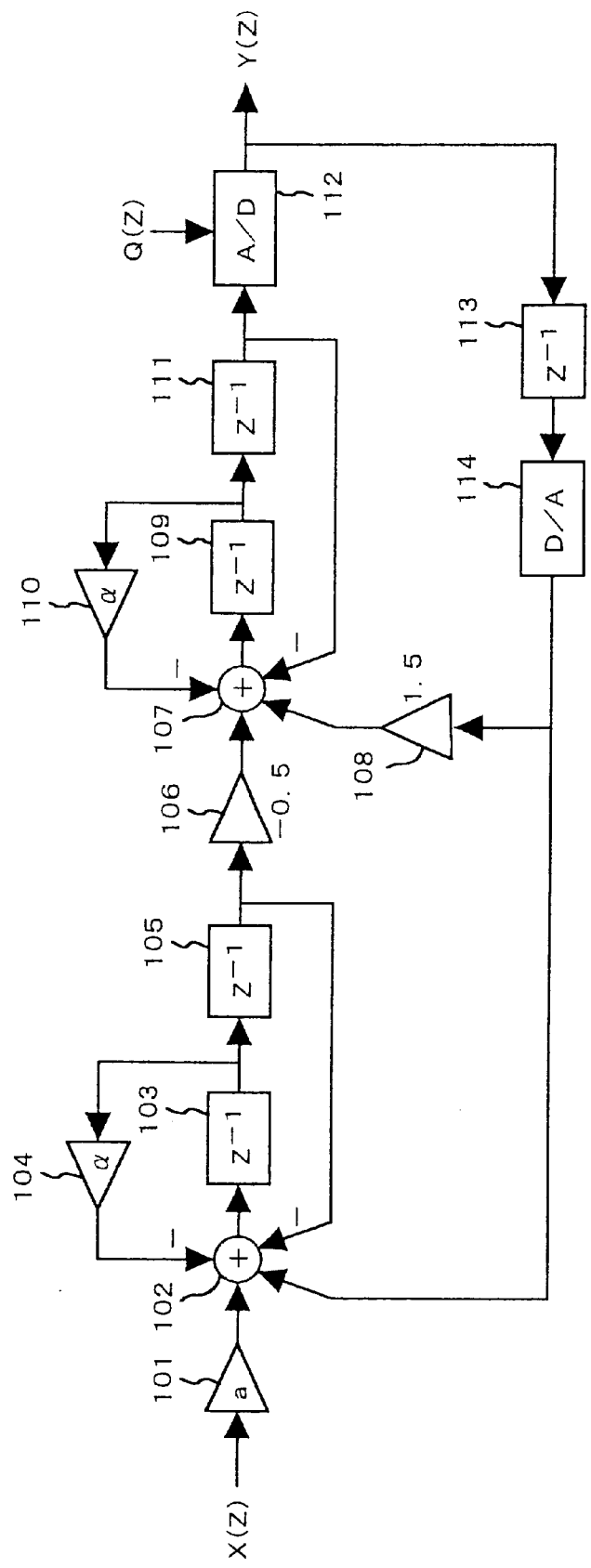
FIG. 2 is a block diagram showing the structure of the delta sigma type AD converter.

FIG. 2 is a block diagram showing the structure of the delta sigma type AD converter 20 according to this embodiment. The delta sigma type AD converter 20 shown in FIG. 2 is of band pass filter having the second order, including a coefficient buffer 101, a computing element 102, a delay unit 103, a coefficient buffer 104, a delay unit 105, a coefficient buffer 106, a computing element 107, a coefficient buffer 108, a delay unit 109, a coefficient buffer 110, a delay unit 111, a quantizing unit 112, a delay unit 113 and a DA converting portion 114. With such a structure, an input signal X(Z) is supplied with the characteristic which is determined by a transmission function described later so as to generate digitized output signal Y(Z) and simultaneously damp quantization noise Q(Z) with the second order noise shaping characteristic.

Under the above-described structure, the coefficient buffers 101, 104, 106, 108, 110 are devices which amplify the input signal with a predetermined coefficient and output. The delay units 103, 105, 109, 111, 113 are devices which delay the input signal by a clock and output. The computing elements 102, 107 are devices which execute addition/subtraction on plural input signals according to a predetermined combination and output. The quantizing unit 112 is a device which quantizes the input signal with the sampling frequency fs so as to convert to digital signal. The DA converting portion 114 is a device which converts the input digital signal to analog signal for feedback.

The feature of the structure shown in FIG. 2 is that the output of the delay unit 103 is fed back to the computing element 102 by means of the coefficient buffer 104 while the output of the delay unit 109 is fed back to the computing element 107 by means of the coefficient buffer 110. With such a structure, the frequency characteristic of the delta sigma type AD converter 20 can be adjusted appropriately depending upon coefficient α□ of the coefficient buffers 104, 110.

In the delta sigma type AD converter 20 having the structure shown in FIG. 2, the relationship between the input signal X(Z) and the output signal Y(Z) is expressed with a following expression (1).

$$Y(Z)=-aX(Z)Z^{-4}+(1+\alpha Z^{-1}+Z^{-2})^2 Q(Z) \quad (1)$$

(a is the coefficient of the coefficient buffer 101)

This expression (1) corresponds to the transmission function between the input signal X(Z) and the output signal Y(Z) and simultaneously specifies the frequency characteristic of the quantization noise Q(Z) contained in the expression (1). According to this embodiment, it is necessary to reduce the quantization noise Q(Z) to as zero as possible in the frequency band of the IF signal expected to be the input signal X(Z). Therefore, transmission zero point which is determined by a coefficient $(1+\alpha Z^{-1}+Z^{-2})$ of the quantization noise Q(z) in the expression (1) may coincide with the IF signal.

Figure 3:
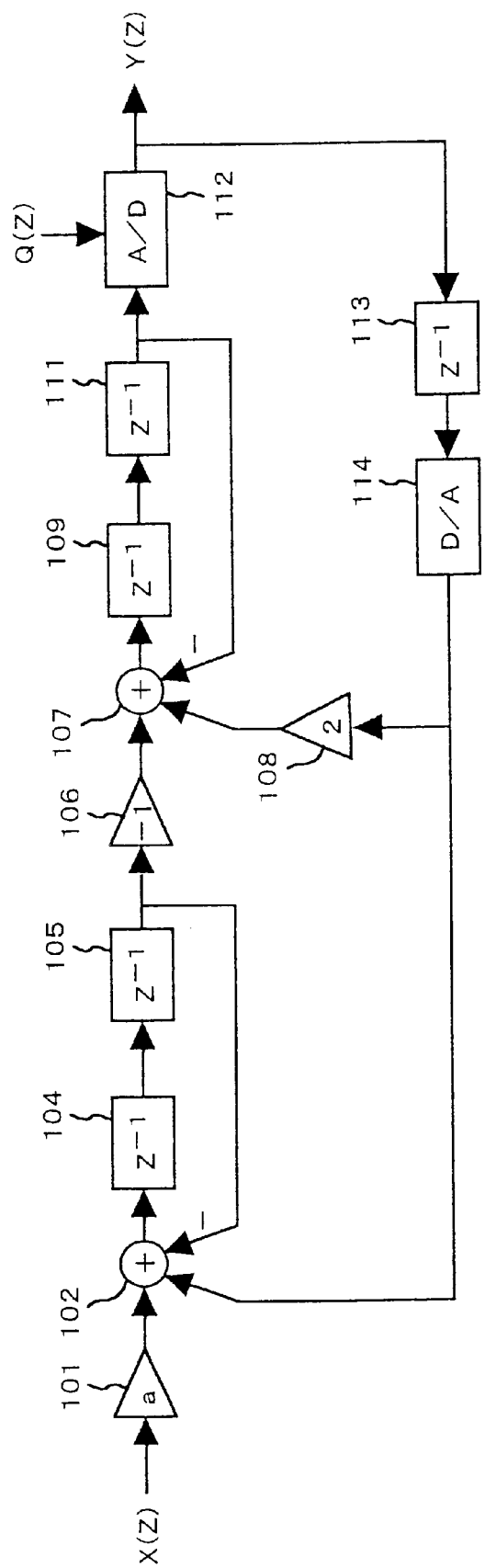
FIG. 3 is a block diagram showing the structure of the delta sigma type AD converter not provided with coefficient buffers 104, 110 in the structure of FIG. 2.

Here, the structure shown in FIG. 2 will be described in comparison with the structure based a structure not provided with the coefficient buffers 104, 110, namely, on the conventional technology. FIG. 3 is a block diagram showing the structure of the delta sigma type AD converter not provided with the coefficient buffers 104, 110 in the structure shown in FIG. 2. The components shown in FIG. 3 are basically the same as the components of FIG. 2 having the like reference numerals except respective coefficient values of the coefficient buffers 106, 108.

Under the structure shown in FIG. 3, the relationship between the input signal X(Z) and the output signal Y(Z) corresponding to the expression (1) is expressed with an expression (2).

$$Y(Z)=-aX(Z)Z^{-4}+(1+Z^{-2})^2 Q(Z) \quad (2)$$

In case of the expression (2), the coefficient of the quantization noise Q(Z) is $(1+Z^{-2})^2$, different from the expression (1). Thus, there is no room for adjusting the frequency characteristic of the quantization noise Q(Z) corresponding to the transmission zero point. Actually, corresponding to the transmission zero point determined by the expression (2), generally the relationship between the sampling frequency fs and the IF frequency in the quantizing unit 112 is set to 4:1. Alternatively, if it is intended to set the relationship between the sampling frequency fs and the folded frequency of the IF frequency to be 4:1, the relationship between the sampling frequency fs and the IF frequency is set 4:3. For example, in case where the IF frequency is 10.7 MHz, the sampling frequency fs is 42.8 MHz in the former setting while the sampling frequency fs is 14.25 MHz in the latter setting. Thus, the structure of FIG. 3 indicates that the relationship between the sampling frequency fs and the IF frequency becomes a fixed frequency relationship in order to optimize the noise shaping characteristic to the quantization noise Q(Z).

Contrary to this, according to the structure of FIG. 2, the transmission zero point determined by the expression (1) is moved on the frequency axis depending upon the coefficient α of the coefficient buffers 104, 110. The frequency relationship of the delta sigma type AD converter 20 can be easily adjusted so as to optimize the noise shaping characteristic to the quantization noise Q(Z).

Figure 4:
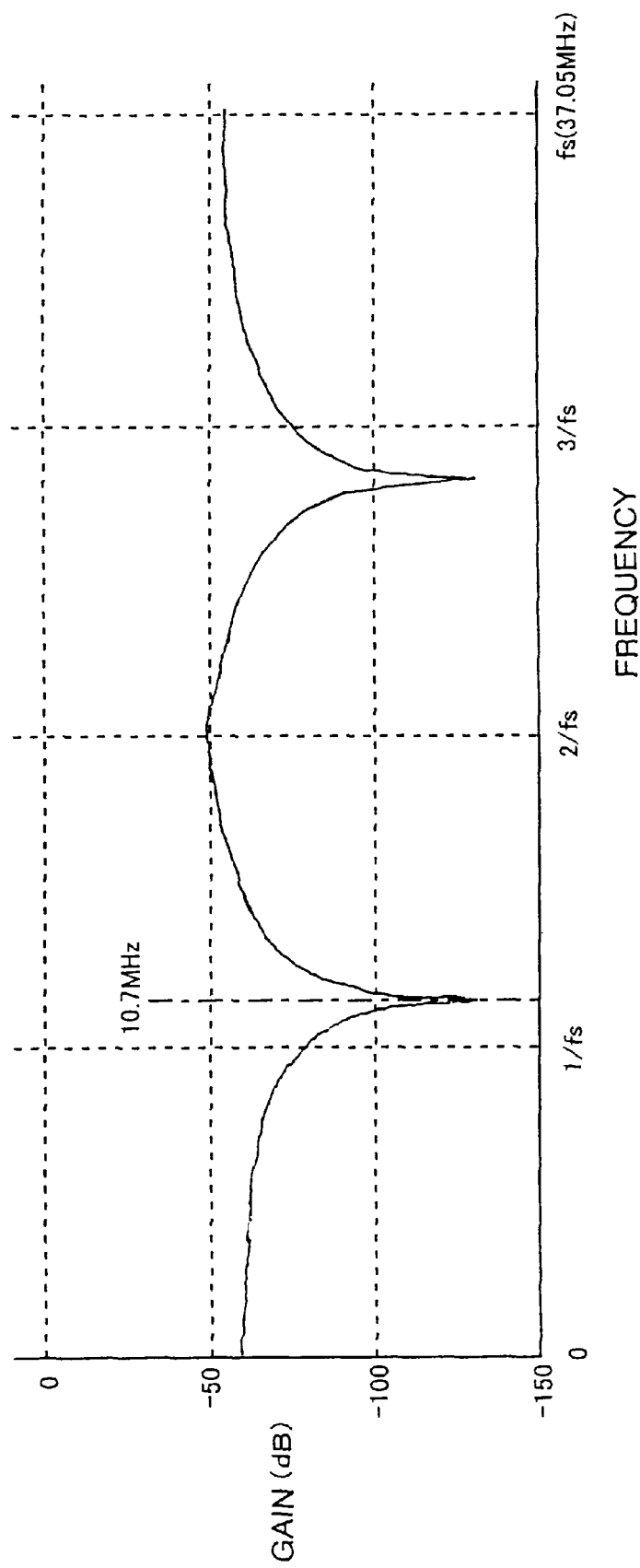
FIG. 4 is a diagram showing the frequency characteristic corresponding to a setting example of the delta sigma type AD converter having the structure of FIG. 2.

FIG. 4 is a diagram showing the frequency characteristic corresponding to a setting example of the delta sigma type AD converter 20 having the structure shown in FIG. 2. The example shown in FIG. 4 shows that the aforementioned coefficient α is set to be 0.485 while the sampling frequency fs is set to be 37.05 MHz. Although the conventional delta sigma type AD converter 20 provides a frequency characteristic having a notch at frequencies ¼ and ¾ the sampling frequency fs, it is evident that the case shown in FIG. 4 is shifted from the aforementioned frequency. The frequency shown in FIG. 4 has the notch when the IF frequency is 10.7 MHz corresponding to AM/FM. In this case, the relationship between the sampling frequency fs and the IF frequency is almost 3.46:1, which is not restricted by the above-described 4:1 or 4:3.

When the setting of the delta sigma type AD converter 20 having the structure shown in FIG. 2 is determined, the sampling frequency fs is determined considering various kinds of conditions depending on a residential area to a given IF frequency and then a frequency relationship allowing a desired frequency characteristic to be achieved is set up. In the example shown in FIG. 4, harmonics like twofold wave or threefold wave of the sampling frequency fs does not overlap a reception band. This example is a setting suitable for preventing reception performance from being deteriorated by harmonics of the sampling frequency fs in the delta sigma type AD converter, even if it jumps into radio system and disturbs it, .

Meanwhile, various kinds of settings as well as this example to the coefficient α and sampling frequency fs can be considered. For example, the coefficient α may be set to 0.77 while the sampling frequency fs may be set to 34.2 MHz. This is a setting suitable for preventing reception noise from being induced by the sampling frequency fs in the delta sigma type AD converter 20 used in Japan because the harmonics of the sampling frequency fs does not overlap the reception band of FM broadcasting and AM broadcasting in Japan. Further, the coefficient α may be set to 0.23 while the sampling frequency fs may be set to 39.9 MHz. This is a setting suitable for preventing reception noise from being induced by the sampling frequency fs in the delta sigma type AD converter 20 used in the US and Europe, because the harmonics of the sampling frequency fs does not overlap the reception band of FM broadcasting and AM broadcasting in the US and Europe.

Figure 5:
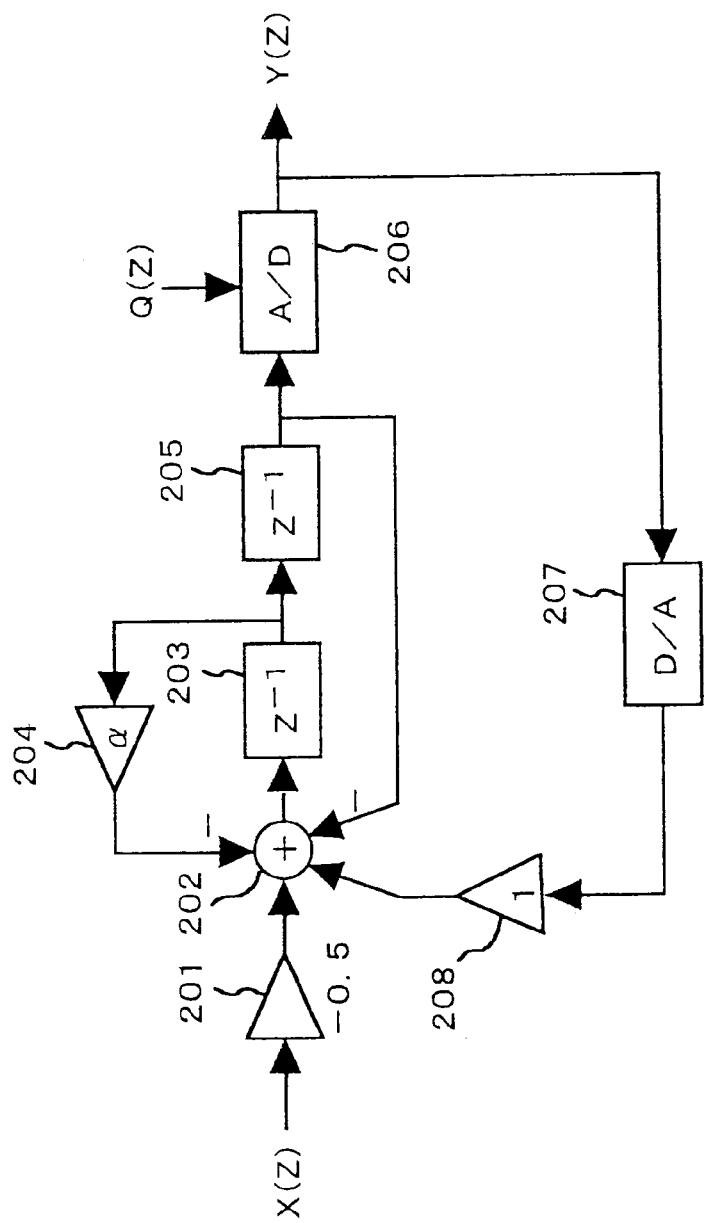
FIG. 5 is a block diagram of the delta sigma type AD converter composed of the first order.

Next, a modification of the delta sigma type AD converter 20 of this embodiment will be described. Although FIG. 2 shows the delta sigma type AD converter 20 having the structure of the second order as described above, it is permissible to apply the present invention even if other order than this is selected. FIG. 5 is a block diagram of the delta sigma type AD converter composed of the first order. As shown in FIG. 5, the delta sigma type AD converter 20 of this case comprises a coefficient buffer 201, a computing element 202, a delay unit 203, a coefficient buffer 204, a delay unit 205, a quantizing unit 206, a DA converter 207 and a coefficient buffer 208. Under this structure, the coefficient α is set to only the single coefficient buffer 204. The functions of the respective components in FIG. 5 are the same as the case of FIG. 2.

In the delta sigma type AD converter 20 of the first order shown in FIG. 5, the relationship between the input signal X(Z) and the output signal Y(Z) is expressed according to a following expression (3).

$$Y(Z) = -aX(Z)Z^{-2} + (1 + \alpha Z^{-1} + Z^{-2})Q(Z) \quad (3)$$

Although the frequencies in this expression (3) are common to ones in the expression (1), the noise shaping characteristic in the expression (3) is milder. On the other hand, because the delta sigma type AD converter 20 shown in FIG. 5 enables simplification of its structure, this is effective for reduction of the cost.

Meanwhile, it is permissible to construct the delta sigma type AD converter by increasing the order of the structure of the first order or the second order shown in FIGS. 2 and 5. In this case, by connecting the first-order delta sigma type AD converter 20 shown in FIG. 5 to multiple stages, the order may be increased. Although generally increase of the order of the delta sigma type AD converter 20 is effective for reduction of noise, cost is increased correspondingly. Therefore, it is desirable to select an optimum order considering performance and cost.

Next, other modification of the delta sigma type AD converter of this embodiment will be described. Although any one of the above-described delta sigma type AD converter 20 has a constant frequency, a following modification assumes that the frequency characteristic possessed by the delta sigma type AD converter 20 in an actual digital tuner is selectable.

Figure 6:
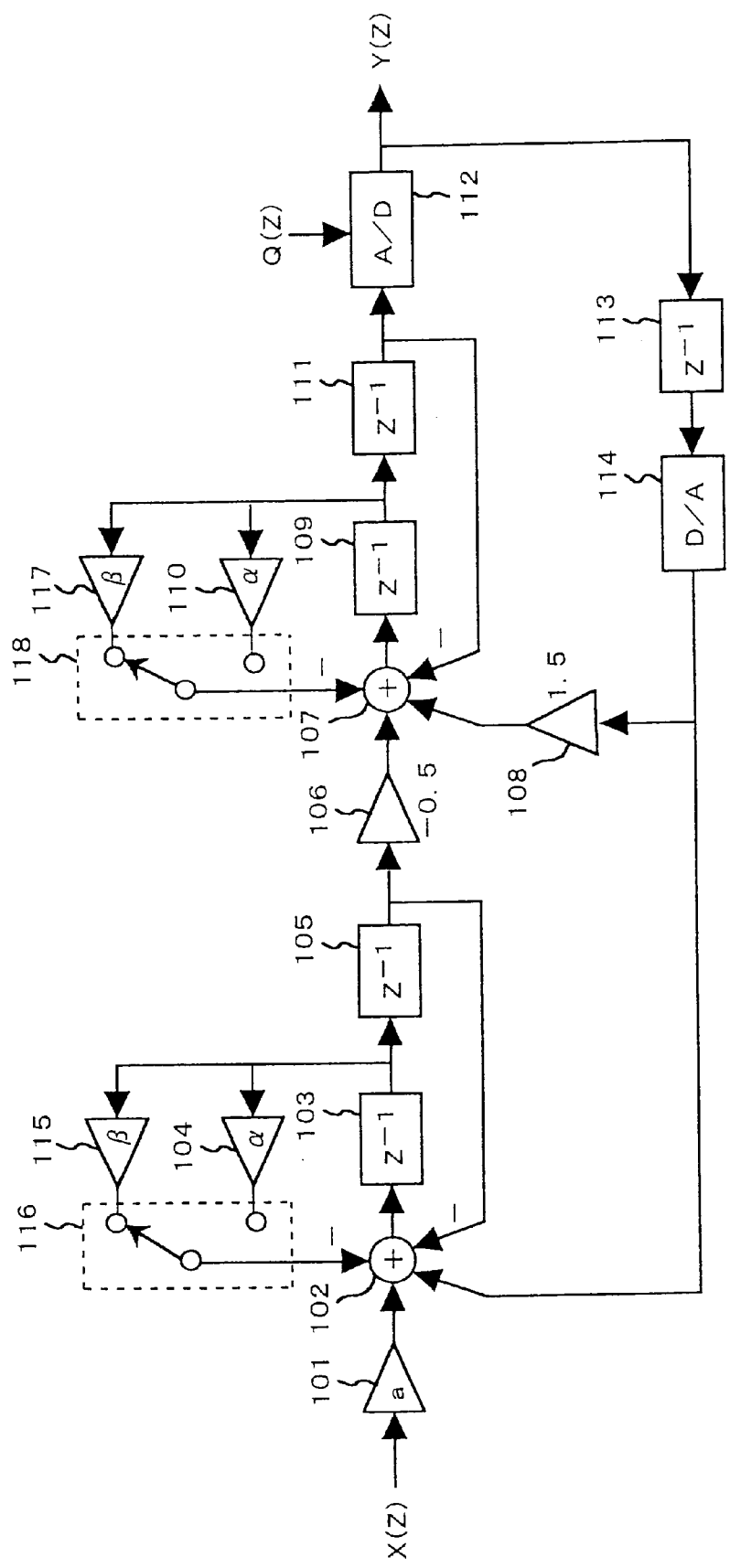
FIG. 6 is a block diagram of the delta sigma type AD converter constructed so that the frequency characteristic can be switched.

FIG. 6 is a block diagram of the delta sigma type AD converter 20 so constructed as to be capable of selecting the frequency characteristic. The delta sigma type AD converter 20 shown in FIG. 6 includes not only the structure shown in FIG. 2 but also a coefficient buffer 115, a switch portion 116, a coefficient buffer 117, and a switch portion 118. The coefficient buffers 115, 117 are connected to the coefficient buffers 104, 110 in parallel respectively, and a coefficient β is set up. The switch portions 116, 118 are devices which change connections to the computing elements 102, 107 to the coefficient buffers 104, 110 in which the coefficient α is set up or the coefficient buffers 115, 117 in which the coefficient β is set up.

Under the above-described structure, if the switch portions 116, 118 are set to the side of the coefficient buffers 104, 110, the delta sigma type AD converter 20 has the characteristic following the expression (1). On the other hand, when the switch portions 116, 118 are changed to the side of the coefficient buffers 115, 117, the delta sigma type AD converter 20 has the characteristic following a following expression (4).

$$Y(Z) = -aX(Z)Z^{-4} + (1 + \beta Z^{-1} + Z^{-2})Q(Z) \quad (4)$$

Thus, by adjusting the coefficients α, β independently, the delta sigma type AD converter is available for two different kinds of the frequency characteristics. At this time, with the sampling frequency fs selectable to two kinds, if the sampling frequency fs is changed when the coefficients α, β are changed, the frequency characteristic may be controlled freely.

For example, with α=0.77, fs=34.2 MHz preferable for use in Japan as the first setting, and with β=0.23, fs=39.9 MHz preferable for use overseas as the second setting, the first setting and the second setting may be changed over depending upon shipment destination of the digital tuner. Such a structure can avoid harmonic noise overlapping a reception band in any area and is effective for high-speed tuning. Even if harmonic noise overlapping the reception band can be avoided by setting α=0.485, fs=37.05 MHz as described with reference to FIG. 4, the frequency supplied to the PLL is used as 50 kHz step because the sampling frequency fs is not divided by 100 kHz completely. On the other hand, 100 kHz step can be the frequency supplied to the PLL because the first setting and the second setting allow the sampling frequency fs to be divided by 100 kHz completely, a relative tuning can be executed relatively at high speeds.

Although, a case where the delta sigma type AD converter of the present invention is applied to a digital tuner capable of receiving FM broadcasting and AM broadcasting has been described in the respective embodiments, the present invention is not restricted to this example. The present invention may be applied widely to various kinds of apparatuses including a structure for quantizing the input analog signal and converting to output digital signal.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2001-146598 filed on May 16, 2001 including the specification, claims, drawings and summary is incorporated herein by reference in its entirety.

What is claimed is:

1. A delta sigma type AD converter for quantizing an input analog signal, converting it to an output digital signal, and outputting the output digital signal, the delta sigma type AD converter comprising:
    a computing device which subtracts a first feedback signal and a second feedback signal from said input analog signal and adds a third feedback signal thereto to form a computed output signal;
    a delay device which comprises first and second delay elements connected in series, wherein the first delay element is on a preceding stage of the delay device for receiving the computed signal from the computing device, for delaying the computed signal with a first delay, and outputting a first delayed signal to the second delay element, and wherein the second delay element is on a latter stage of the delay device for receiving the first delayed signal, for delaying the first delayed signal with a second delay, and outputting a second delayed signal to the computing device as the second feedback signal;
    a first feedback device which receives the first delayed signal, multiplies the first delayed signal from said delay device with a predetermined coefficient α and outputs it to the computing device as said first feedback signal;
    a quantizing device which receives the second delayed signal, quantizes the second delayed signal from said delay device with a sampling frequency, converts it, thereby forming the output digital signal and outputs the output digital signal; and
    a second feedback device which converts said output digital signal to an analog signal and outputs it to the computing device as said third feedback signal.

2. The delta sigma type AD converter as claimed in claim 1, wherein respective stages each containing said computing device, said delay device, and said first feedback device are connected through n stages, and the output signal goes back to each computing device respectively through said quantizing device and said second feedback device.

3. The delta sigma type AD converter as claimed in claim 1, wherein said first feedback device is constructed so as to be capable of changing over two or more coefficients as said predetermined coefficient.

4. The delta sigma type AD converter as claimed in claim 2, wherein said first feedback device is constructed so as to be capable of changing over two or more coefficients as said predetermined coefficient.

5. The delta sigma type AD converter as claimed in claim 1, wherein said input analog signal is an IF signal corresponding to broadcasting wave and said predetermined coefficient and said sampling frequency are set so that the frequency characteristic of said quantization noise has a transmission zero point in the frequency band of said IF signal.

6. The delta sigma type AD converter as claimed in claim 2, wherein said input analog signal is an IF signal corresponding to broadcasting wave and said predetermined coefficient and said sampling frequency are set so that the frequency characteristic of said quantization noise has a transmission zero point in the frequency band of said IF signal.

7. The delta sigma type AD converter as claimed in claim 5, wherein said predetermined coefficient and said sampling frequency are set so that the harmonics of said sampling frequency does not overlap the reception band of said broadcasting wave.

8. The delta sigma type AD converter as claimed in claim 6, wherein said predetermined coefficient and said sampling frequency are set so that the harmonics of said sampling frequency does not overlap the reception band of said broadcasting wave.

9. A n-order delta sigma type AD converter for quantizing an input analog signal and converting it to an output digital signal, comprising:
    a signal processing device which executes filter processing corresponding to a transmission function to said input analog signal; and
    a quantizing device which quantizes the input analog signal subjected to said filter processing with a sampling frequency, converts it to output digital signal, and outputs,
    wherein when quantizing noise applied by said quantizing device is $Q(Z)$ and a predetermined coefficient is α, said output digital signal includes a component indicated by $(1+\alpha Z^{-1}+Z^{-2})^n Q(Z)$,
    wherein said input analog signal is an IF signal corresponding to broadcasting wave, and
    said predetermined coefficient and said sampling frequency are set so that the frequency characteristic of said quantization noise has a transmission zero point in the frequency band of said IF signal,
    wherein aid predetermined coefficient and said sampling frequency are set so that the harmonics of said sampling frequency does not overlap the reception band of said broadcasting wave,
    wherein said first feedback device is constructed so as to be capable of switching a first coefficient corresponding to a first area and a second coefficient corresponding to a second area as said predetermined coefficient and capable of selecting a first sampling frequency corresponding to said first coefficient and a second sampling frequency corresponding to said second coefficient, and
    said first coefficient and said first sampling frequency are set so that harmonics of said first sampling frequency does not overlap the reception band of broadcasting wave in said first area while said second coefficient and said second sampling frequency are set so that the harmonics of the second sampling frequency does not overlap the reception band of broadcasting wave in said second area.

10. The delta sigma type AD converter as claimed in claim 7, wherein said first feedback device is constructed so as to be capable of switching a first coefficient corresponding to a first area and a second coefficient corresponding to a second area as said predetermined coefficient and capable of selecting a first sampling frequency corresponding to said first coefficient and a second sampling frequency corresponding to said second coefficient, and said first coefficient and said first sampling frequency are set so that harmonics of said first sampling frequency does not overlap the reception band of broadcasting wave in said first area while said second coefficient and said second sampling frequency are set so that the harmonics of the second sampling frequency does not overlap the reception band of broadcasting wave in said second area.

11. The delta sigma type AD converter as claimed in claim 8, wherein said first feedback device is constructed so as to be capable of switching a first coefficient corresponding to a first area and a second coefficient corresponding to a second area as said predetermined coefficient and capable of selecting a first sampling frequency corresponding to said first coefficient and a second sampling frequency corresponding to said second coefficient, and said first coefficient and said first sampling frequency are set so that harmonics of said first sampling frequency does not overlap the reception band of broadcasting wave in said first area while said second coefficient and said second sampling frequency are set so that the harmonics of the second sampling frequency does not overlap the reception band of broadcasting wave in said second area.

* * * * *